(12) United States Patent
Yamaguchi et al.

(10) Patent No.: US 11,380,463 B2
(45) Date of Patent: Jul. 5, 2022

(54) SUPERCONDUCTING WIRE AND SUPERCONDUCTING COIL

(71) Applicant: Sumitomo Electric Industries, Ltd., Osaka (JP)

(72) Inventors: Takashi Yamaguchi, Osaka (JP); Tatsuoki Nagaishi, Osaka (JP); Masaya Konishi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 405 days.

(21) Appl. No.: 16/482,355

(22) PCT Filed: Feb. 14, 2017

(86) PCT No.: PCT/JP2017/005301
§ 371 (c)(1),
(2) Date: Jul. 31, 2019

(87) PCT Pub. No.: WO2018/150457
PCT Pub. Date: Aug. 23, 2018

(65) Prior Publication Data
US 2021/0134488 A1    May 6, 2021

(51) Int. Cl.
*H01B 1/02* (2006.01)
*H01B 13/22* (2006.01)
(Continued)

(52) U.S. Cl.
CPC .............. *H01B 12/06* (2013.01); *H01B 13/22* (2013.01); *H01F 6/06* (2013.01); *H01L 39/2461* (2013.01)

(58) Field of Classification Search
CPC .......... H01B 9/02; H01B 12/06; H01B 12/14; H01B 12/16; H01B 13/22; H01L 39/22;
(Continued)

(56) References Cited

U.S. PATENT DOCUMENTS 4,509,030 A * 4/1985 Vermilyea .......... G01R 33/3875
324/320
2011/0244234 A1* 10/2011 Taneda ................ C23C 28/322
428/375
(Continued)

FOREIGN PATENT DOCUMENTS

| JP | 2008/244249 A | * | 10/2008 | ............. Y02E 40/60 |
| JP | 2008-244249 A | | 10/2008 | |
| JP | 2011-198469 A | | 10/2011 | |
| JP | 2014-22693 A | | 2/2014 | |

(Continued)

OTHER PUBLICATIONS

JP2015198009A (Translation) (Year: 2021).*
(Continued)

*Primary Examiner* — Timothy J Thompson
*Assistant Examiner* — John B Freal
(74) *Attorney, Agent, or Firm* — Faegre Drinker Biddle & Reath LLP (57) ABSTRACT

A superconducting coil according to the present disclosure includes: a substrate having a first surface and a second surface; a superconducting layer having a third surface and a fourth surface; respective stabilization layers; and respective protective layers. The second surface is opposite to the first surface. The fourth surface is opposite to the third surface. The superconducting layer is disposed on the substrate such that the third surface faces the second surface. The respective stabilization layers are disposed on the first surface and the fourth surface. The respective protective layers are disposed on the stabilization layers. Adhesion strength between each of the stabilization layers and each of the protective layers is lower than strength of the superconducting layer.

5 Claims, 6 Drawing Sheets

(51) Int. Cl.
     *H01F 6/06*         (2006.01)
     *H01L 39/24*       (2006.01)
     *H01B 12/06*      (2006.01)
     *H01L 39/14*       (2006.01)
     *H01L 39/00*       (2006.01)

(58) Field of Classification Search
     CPC . H01L 39/2461; H01L 39/143; H01L 39/248;
                                  Y02E 40/60; H01F 6/06
     See application file for complete search history.

(56) References Cited

U.S. PATENT DOCUMENTS

2014/0038829 A1*   2/2014   Hanafusa ............... H01B 12/02
                                                                             505/473
2017/0133127 A1*   5/2017   Yamaguchi ........... H01L 39/143
2018/0012690 A1*   1/2018   Morita ...................... H01F 1/10

FOREIGN PATENT DOCUMENTS

| JP | 2015-198009 A | | 11/2015 | | |
|----|---------------|---|---------|---|---|
| JP | 2016-134418 A | | 7/2016 | | |
| JP | 2015/198009 A | * | 11/2019 | ............. | Y02E 40/60 |
| KR | 2014/0033428 A | * | 3/2014 | ............. | H01B 12/06 |

OTHER PUBLICATIONS

KR20140033428A (Translation) (Year: 2021).*
JP2008244249A (Translation) (Year: 2021).*
Definition of Coil (Year: 2021).*

* cited by examiner

SUPERCONDUCTING WIRE AND SUPERCONDUCTING COIL

TECHNICAL FIELD

The present invention relates to a superconducting wire and a superconducting coil.

BACKGROUND ART

Conventionally, a superconducting wire described in Japanese Patent Laying-Open No. 2008-244249 (Patent Literature 1) has been known. The superconducting wire described in Patent Literature 1 includes: a substrate; a superconducting layer disposed on the substrate; and stabilization layers that coat the substrate and the superconducting layer. The superconducting wire described in Patent Literature 1 is wound and is impregnated with an impregnating material such as an epoxy resin, thereby obtaining a superconducting coil. In the superconducting coil described in Patent Literature 1, it has been known that a superconducting property may be deteriorated due to the superconducting layer being broken by thermal stress resulting from a difference between the thermal expansion coefficient of the impregnating material and the thermal expansion coefficient of the superconducting wire.

As configurations for preventing the above-described breakage of the superconducting layer due to the thermal stress resulting from the difference in thermal expansion coefficient, the following configurations have been conventionally known: the configuration of an insulation coating oxide superconducting wire described in Japanese Patent Laying-Open No. 2011-198469 (Patent Literature 2); the configuration of a composite tape described in Japanese Patent Laying-Open No. 2014-22693 (Patent Literature 3); and the configuration of a superconducting wire described in Japanese Patent Laying-Open No. 2016-134418 (Patent Literature 4).

The insulation coating oxide superconducting wire described in Patent Literature 2 includes: an oxide superconducting wire material; an insulating material layer that coats the entire surface of the oxide superconducting wire material; and a releasing material layer provided on the insulating material layer. The insulation coating oxide superconducting wire described in Patent Literature 2 is wound and is impregnated with a thermosetting resin, thereby obtaining a coil. Also in the coil described in Patent Literature 2, thermal stress resulting from a difference between the thermal expansion coefficient of the thermosetting resin and the thermal expansion coefficient of the insulation coating oxide superconducting wire is caused during cooling. In the coil described in Patent Literature 2, the thermosetting resin and the releasing material layer are readily detached from each other at an interface therebetween, whereby the thermal stress is less likely to act on the superconducting layer and the superconducting property is less likely to be deteriorated due to breakage of the superconducting layer.

The composite tape described in Patent Literature 3 includes a superconducting tape wire, an insulating tape wire, and a releasing layer. The releasing layer is disposed on at least one of the superconducting tape wire and the insulating tape wire. The composite tape described in Patent Literature 3 is wound and is impregnated with an epoxy resin, thereby obtaining a coil. Also in the coil described in Patent Literature 3, thermal stress is caused during cooling. In the coil described in Patent Literature 3, the epoxy resin and the releasing layer are detached from each other at an interface therebetween, whereby the superconducting property is less likely to be deteriorated due to the superconducting layer being broken by the thermal stress.

The superconducting wire described in Patent Literature 4 includes a metal substrate, a superconducting layer, and a carbon layer. The superconducting layer is disposed on the metal substrate. The carbon layer is disposed on at least one of the superconducting layer and the metal substrate. The breaking strength of the carbon layer is lower than that of the superconducting layer. The superconducting wire described in Patent Literature 4 is wound and is impregnated with an epoxy resin composition, thereby obtaining a coil. Also in the coil described in Patent Literature 4, thermal stress resulting from a difference between the thermal expansion coefficient of the epoxy resin composition and the thermal expansion coefficient of the superconducting wire is caused during cooling. With this thermal stress, the carbon layer is readily fractured. Accordingly, the superconducting property is less likely to be deteriorated due to the superconducting layer being broken by this thermal stress.

CITATION LIST

Patent Literature

PTL 1: Japanese Patent Laying-Open No. 2008-244249
PTL 2: Japanese Patent Laying-Open No. 2011-198469
PTL 3: Japanese Patent Laying-Open No. 2014-22693
PTL 4: Japanese Patent Laying-Open No. 2016-134418

SUMMARY OF INVENTION

A superconducting wire according to one embodiment of the present disclosure includes: a substrate having a first surface and a second surface; a superconducting layer having a third surface and a fourth surface; respective stabilization layers; and respective protective layers. The second surface is opposite to the first surface. The fourth surface is opposite to the third surface. The superconducting layer is disposed on the substrate such that the third surface faces the second surface. The respective stabilization layers are disposed on the first surface and the fourth surface. The respective protective layers are disposed on the stabilization layers. Adhesion strength between each of the stabilization layers and each of the protective layers is lower than strength of the superconducting layer.

A superconducting coil according to the present disclosure includes the superconducting wire according to the present disclosure, and an insulator. The superconducting wire is wound to have a spiral shape with a space being interposed between windings of the superconducting wire. The space is filled with the insulator. The insulator has a thermal expansion coefficient larger than a thermal expansion coefficient of the superconducting layer.

DETAILED DESCRIPTION

Problem to be Solved by the Present Disclosure

For the insulation coating superconducting wire and the coil employing the insulation coating superconducting wire in Patent Literature 2, it is necessary to add a new step of forming the releasing material layer. Also for the composite tape and the coil employing the composite tape in Patent Literature 3, it is necessary to add a new step of forming the releasing layer. Also for the superconducting wire and the coil employing the superconducting wire in Patent Literature 4, it is necessary to add a new step of forming the carbon layer. Thus, for the respective superconducting wires and the respective coils employing the superconducting wires in Patent Literature 2 to Patent Literature 4, manufacturing processes are complicated, disadvantageously.

A superconducting wire and a superconducting coil according to the present disclosure have been made in view of the above-described problem of the conventional techniques. More specifically, the present disclosure is to provide a superconducting wire and a superconducting coil, in each of which a superconducting property can be suppressed from being deteriorated by thermal stress resulting from a difference between the thermal expansion coefficient of an insulator and the thermal expansion coefficient of the superconducting wire without complicating a manufacturing process.

Advantageous Effect of the Present Disclosure

According to the superconducting wire and the superconducting coil according to the present disclosure, a superconducting property can be suppressed from being deteriorated by thermal stress resulting from a difference between the thermal expansion coefficient of an insulator and the thermal expansion coefficient of the superconducting wire without complicating a manufacturing process.

Description of Embodiments

First, embodiments of the present disclosure are listed and described.

(1) A superconducting wire according to one embodiment of the present disclosure includes: a substrate having a first surface and a second surface; a superconducting layer having a third surface and a fourth surface; respective stabilization layers; and respective protective layers. The second surface is opposite to the first surface. The fourth surface is opposite to the third surface. The superconducting layer is disposed on the substrate such that the third surface faces the second surface. The respective stabilization layers are disposed on the first surface and the fourth surface. The respective protective layers are disposed on the stabilization layers. Adhesion strength between each of the stabilization layers and each of the protective layers is lower than strength of the superconducting layer.

In the manufacturing of the superconducting wire according to (1), no new step of forming a carbon layer or the like is required. Hence, according to the superconducting wire according to (1), the manufacturing process is not complicated. Moreover, when forming a superconducting coil, the superconducting wire according to (1) is shaped into a spiral shape and a space between windings of the superconducting wire is filled with an insulator. According to the superconducting wire according to (1), the stabilization layer and the protective layer are detached from each other at an interface therebetween before the superconducting layer is broken due to the thermal stress resulting from the difference between the thermal expansion coefficient of the superconducting wire and the thermal expansion coefficient of the insulating material. Therefore, according to the superconducting wire according to (1), the superconducting property can be suppressed from being deteriorated.

(2) In the superconducting wire according to (1), a thickness of the stabilization layer disposed on the first surface may be smaller than a thickness of the stabilization layer disposed on the fourth surface.

According to the superconducting wire according to (2), since the stabilization layer or protective layer at the first surface side distant away from the superconducting layer is likely to be detached first, the superconducting layer can be protected more securely.

(3) In the superconducting wire according to (2), the stabilization layer disposed on the first surface may be constituted of a single layer, and the stabilization layer disposed on the fourth surface may be constituted of a plurality of layers.

According to the superconducting wire according to (3), since the stabilization layer or protective layer at the first surface side distant away from the superconducting layer is likely to be detached first, the superconducting layer can be protected more securely.

(4) In the superconducting wire according to (3), the stabilization layer disposed on the first surface may be constituted of a sputtering layer, and the stabilization layer disposed on the fourth surface may be constituted of a sputtering layer disposed on the fourth surface and a plating layer disposed on the sputtering layer.

According to the superconducting wire according to (4), since the stabilization layer or protective layer at the first surface side distant away from the superconducting layer is likely to be detached first, the superconducting layer can be protected more securely.

(5) A superconducting coil according to one embodiment of the present disclosure includes: the superconducting wire according to any one of (1) to (4); and an insulator having a thermal expansion coefficient larger than a thermal expansion coefficient of the superconducting layer. The superconducting wire is wound to have a spiral shape with a space being interposed between windings of the superconducting wire. The space is filled with the insulator.

According to the superconducting coil according to (5), the superconducting property can be suppressed from being deteriorated by thermal stress resulting from a difference between the thermal expansion coefficient of the insulator and the thermal expansion coefficient of the superconducting wire without complicating a manufacturing process.

Details of Embodiments of the Present Disclosure

Next, details of the embodiments will be described.

Configuration of Superconducting Wire According to Embodiment

The following describes a configuration of a superconducting wire according to an embodiment with reference to figures. It should be noted that the same or corresponding portions in the figures are given the same reference characters. Moreover, at least parts of the embodiment described below may be appropriately combined.

Figure 1:
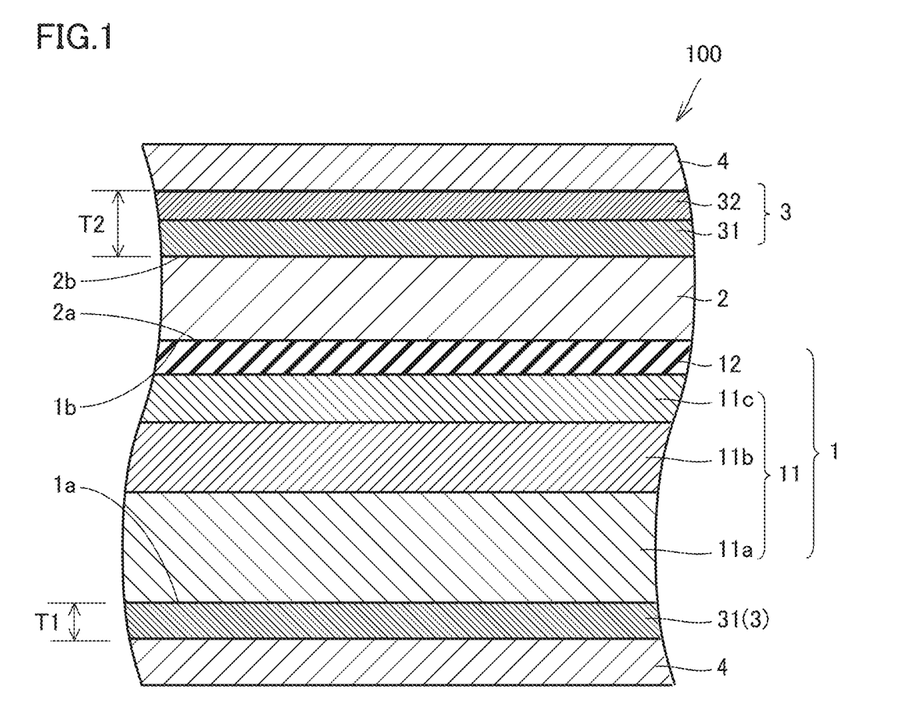
FIG. 1 is a cross sectional view of a superconducting wire 100 according to the embodiment in a cross section parallel to a longitudinal direction thereof.

FIG. 1 is a cross sectional view of a superconducting wire 100 according to the embodiment in a cross section parallel to a longitudinal direction thereof. As shown in FIG. 1, superconducting wire 100 according to the embodiment has a substrate 1, a superconducting layer 2, stabilization layers 3, and protective layers 4.

Substrate 1 preferably has a tape-like shape having a thickness smaller than the length thereof in the longitudinal direction. Substrate 1 has a first surface 1a and a second surface 1b. Second surface 1b is a surface opposite to first surface 1a. Substrate 1 may be constituted of a plurality of layers. More specifically, substrate 1 may include a substrate layer 11 and an intermediate layer 12. Substrate layer 11 is located at the first surface 1a side, and intermediate layer 12 is located at the second surface 1b side.

Substrate layer 11 may be constituted of a plurality of layers. For example, substrate layer 11 is constituted of a first layer 11a, a second layer 11b, and a third layer 11c. First layer 11a, second layer 11b, and third layer 11c are composed of different materials. Stainless steel is used for first layer 11a, for example. Copper (Cu) is used for second layer 11b, for example. Nickel (Ni) is used for third layer 11c, for example.

Intermediate layer 12 is a layer serving as a buffer for forming superconducting layer 2 on substrate 1. Intermediate layer 12 preferably has a uniform crystal orientation. Moreover, for intermediate layer 12, a material having a small lattice constant mismatch with respect to the material of superconducting layer 2 is used. More specifically, for intermediate layer 12, cerium oxide ($CeO_2$) or yttria stabilized zirconia (YSZ) is used.

Superconducting layer 2 is a layer containing a superconductor. A material used for superconducting layer 2 is a rare-earth-based oxide superconductor, for example. For example, the rare-earth-based oxide superconductor used for superconducting layer 2 is REBCO ($REBa_2Cu_3O_y$, where RE represents a rare earth such as yttrium (Y), praseodymium (Pr), neodymium (Nd), samarium (Sm), europium (Eu), gadolinium (Gd), holmium (Ho), or ytterbium (Yb)).

Superconducting layer 2 has a third surface 2a and a fourth surface 2b. Fourth surface 2b is a surface opposite to third surface 2a. Superconducting layer 2 is disposed on substrate 1. More specifically, superconducting layer 2 is disposed on substrate 1 such that third surface 2a faces second surface 1b. Regarding this, from another viewpoint, it is said that superconducting layer 2 is disposed on intermediate layer 12.

Stabilization layer 3 is a layer for protecting superconducting layer 2, dissipating locally generated heat in superconducting layer 2, and bypassing current upon occurrence of quench (phenomenon in which transition is made from a superconducting state to a normal conducting state) in superconducting layer 2. Stabilization layers 3 are disposed on first surface 1a and fourth surface 2b. A material used for each stabilization layer 3 is silver (Ag), for example.

Stabilization layer 3 disposed on first surface 1a is preferably constituted of a single layer. More preferably, stabilization layer 3 disposed on first surface 1a is a sputtering layer 31. Sputtering layer 31 is a layer formed by sputtering.

Stabilization layer 3 disposed on fourth surface 2b may be constituted of a single layer or may be constituted of a plurality of layers. When stabilization layer 3 disposed on fourth surface 2b is constituted of a single layer, stabilization layer 3 disposed on fourth surface 2b is constituted of sputtering layer 31, for example.

When stabilization layer 3 disposed on fourth surface 2b is constituted of a plurality of layers, stabilization layer 3 disposed on fourth surface 2b is constituted of a sputtering layer 31 and a plating layer 32, for example. Sputtering layer 31 is disposed on fourth surface 2b. Plating layer 32 is disposed on sputtering layer 31. Plating layer 32 is a layer formed by plating.

Regarding the above, from another viewpoint, it is said that the respective outermost layers of stabilization layers 3 disposed on first surface 1a and fourth surface 2b are not layers for securing adhesion with protective layers 4. An exemplary layer for securing adhesion between stabilization layer 3 and protective layer 4 is a strike plating layer. The strike plating layer is a layer formed by strike plating.

Stabilization layer 3 disposed on first surface 1a has a first thickness T1. Stabilization layer 3 disposed on fourth surface 2b has a second thickness T2. First thickness T1 is preferably smaller than second thickness T2. First thickness T1 is, for example, more than or equal to 1 µm and less than or equal to 10 µm, and the second thickness is, for example, more than or equal to 2 µm and less than or equal to 40 µm.

Protective layers 4 are layers for protecting stabilization layers 3. Protective layers 4 are disposed on stabilization layers 3. A material used for each protective layer 4 is Cu, for example.

Adhesion strength between stabilization layer 3 and protective layer 4 is lower than strength of superconducting layer 2. The fact "the adhesion strength between stabilization layer 3 and protective layer 4 is lower than the strength of superconducting layer 2" indicates that stabilization layer 3 and protective layer 4 are detached from each other before superconducting layer 2 is broken.

It should be noted that although not shown in FIG. 1, stabilization layers 3 and protective layers 4 may coat end surfaces of superconducting wire 100 according to the embodiment in a direction perpendicular to the longitudinal direction.

Configuration of Superconducting Coil According to Embodiment

Figure 2:
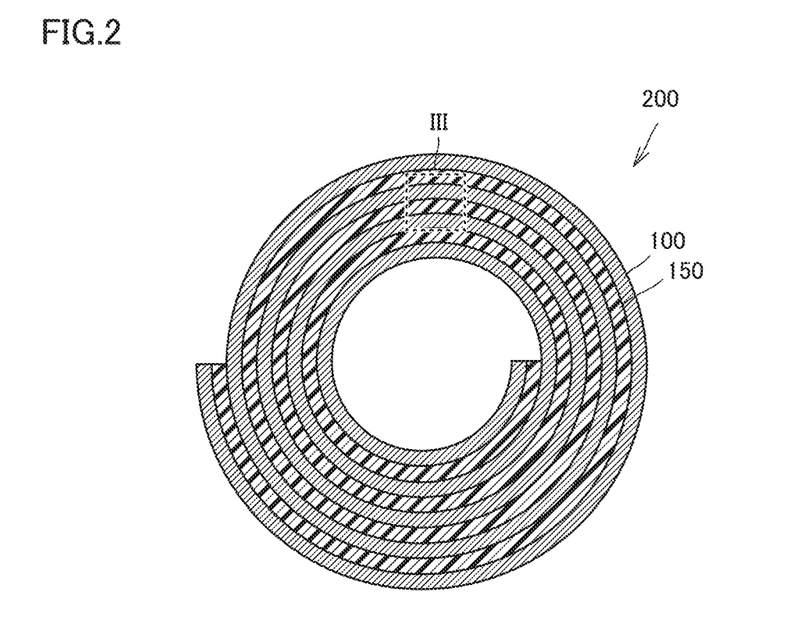
FIG. 2 is a cross sectional view of a superconducting coil 200 according to the embodiment in a cross section perpendicular to a coil axis thereof.

The following describes a configuration of a superconducting coil 200 according to the embodiment with reference to figures. FIG. 2 is a cross sectional view of superconducting coil 200 according to the embodiment in a cross section perpendicular to a coil axis thereof. As shown in FIG. 2, superconducting coil 200 according to the embodiment has superconducting wire 100 and an insulator 150.

Superconducting wire 100 has a spiral shape centering on the coil axis. That is, superconducting wire 100 is wound around the coil axis. Superconducting wire 100 is wound with a space being interposed between windings of superconducting wire 100.

Figure 3:
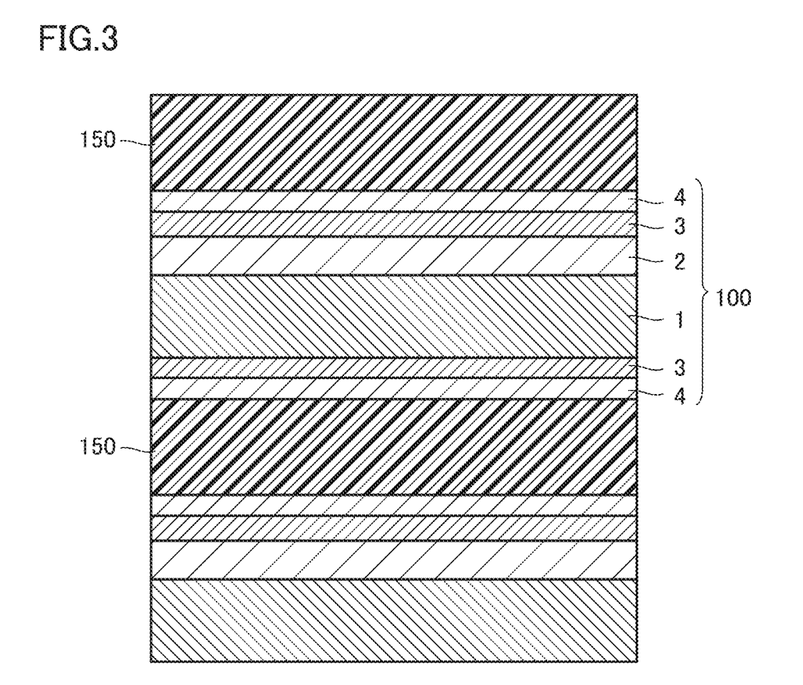
FIG. 3 is an enlarged cross sectional view of a region III of FIG. 2.

The space between the windings of superconducting wire 100 is filled with insulator 150. Accordingly, the windings of superconducting wire 100 are insulated from each other and are fixed relative to each other. FIG. 3 is an enlarged cross sectional view of a region III of FIG. 2. As shown in FIG. 3, superconducting wire 100 is sandwiched by insulator 150.

A thermosetting resin is used for insulator 150, for example. The thermosetting resin used for insulator 150 preferably has a low viscosity to such an extent that the thermosetting resin in a state before being set can be introduced into the space between the windings of superconducting wire 100. The thermosetting resin used for insulator 150 is an epoxy resin, for example.

Insulator 150 has a thermal expansion coefficient larger than that of superconducting wire 100. Specifically, insulator 150 has a thermal expansion coefficient larger than that of superconducting layer 2. The thermal expansion coefficient of insulator 150 may be larger than the thermal expansion coefficient of substrate 1. For example, when the epoxy resin is used for insulator 150, the size of insulator 150 is contracted by about 1% when cooling from a room temperature to 77 K. On the other hand, when substrate 1 is cooled in a similar manner, the size of substrate 1 is contracted by about 0.3%. When superconducting layer 2 is cooled in a similar manner, the size contraction ratio of superconducting layer 2 is less than 0.3%.

Method for Manufacturing Superconducting Wire According to Embodiment

Figure 4:
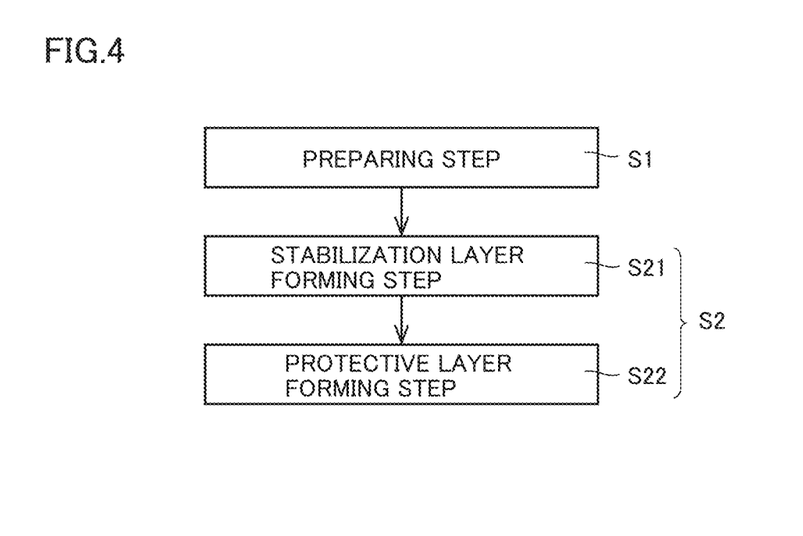
FIG. 4 is a flowchart of the method for manufacturing superconducting wire 100 according to the embodiment.

The following describes a method for manufacturing superconducting wire 100 according to the embodiment. FIG. 4 is a flowchart of the method for manufacturing superconducting wire 100 according to the embodiment. As shown in FIG. 4, the method for manufacturing superconducting wire 100 according to the embodiment has a preparing step S1 and a coating layer forming step S2. Coating layer forming step S2 includes a stabilization layer forming step S21 and a protective layer forming step S22.

Figure 5A:
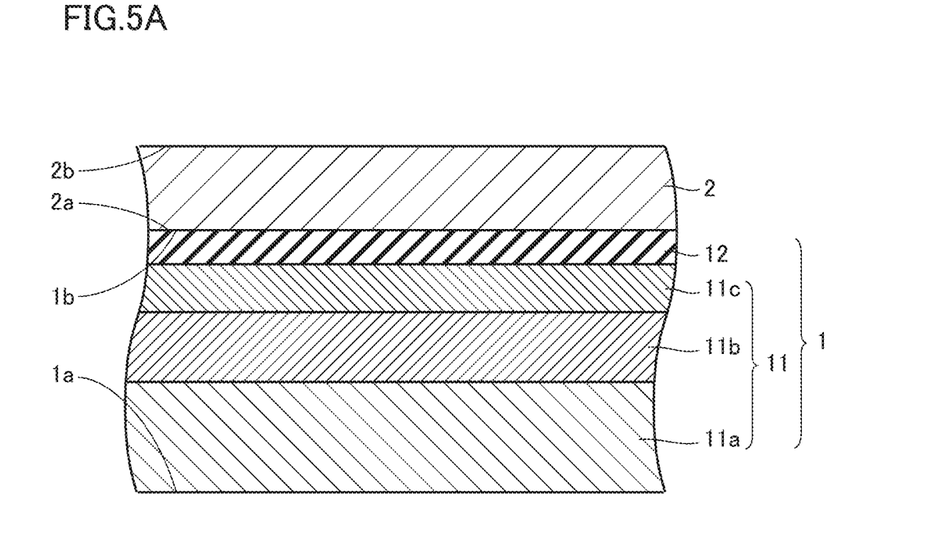
FIG. 5A is a cross sectional view of superconducting wire 100 in the cross section parallel to the longitudinal direction after ending a preparing step S1 and before performing a stabilization layer forming step S21.

FIG. 5A is a cross sectional view of superconducting wire 100 in the cross section parallel to the longitudinal direction after ending preparing step S1 and before performing stabilization layer forming step S21. In preparing step S1, as shown in FIG. 5A, superconducting layer 2 is formed on substrate 1. More specifically, intermediate layer 12 is formed on substrate layer 11, and superconducting layer 2 is formed on intermediate layer 12. Intermediate layer 12 is formed on substrate layer 11 and superconducting layer 2 is formed on intermediate layer 12 by conventionally known methods.

Figure 5B:
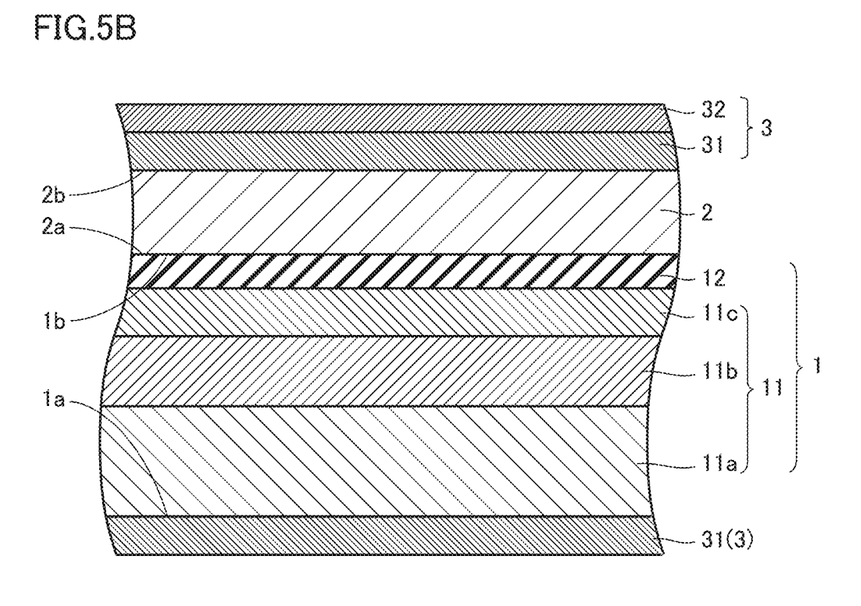
FIG. 5B is a cross sectional view of superconducting wire 100 in the cross section parallel to the longitudinal direction after ending stabilization layer forming step S21 and before performing a protective layer forming step S22.

FIG. 5B is a cross sectional view of superconducting wire 100 in the cross section parallel to the longitudinal direction after ending stabilization layer forming step S21 and before performing protective layer forming step S22. As shown in FIG. 5B, in stabilization layer forming step S21, stabilization layers 3 are formed on first surface 1a and fourth surface 2b.

In stabilization layer forming step S21, first, sputtering is performed. Sputtering is performed to the first surface 1a side and the fourth surface 2b side. Accordingly, sputtering layer 31 serving as stabilization layer 3 is formed on first surface 1a, and sputtering layer 31, which constitutes a portion of stabilization layer 3 disposed on fourth surface 2b, is formed.

In stabilization layer forming step S21, second, plating is performed. Plating is performed only to the fourth surface 2b side. Accordingly, on fourth surface 2b, plating layer 32, which is a portion of stabilization layer 3 disposed on fourth surface 2b, is formed.

Figure 5C:
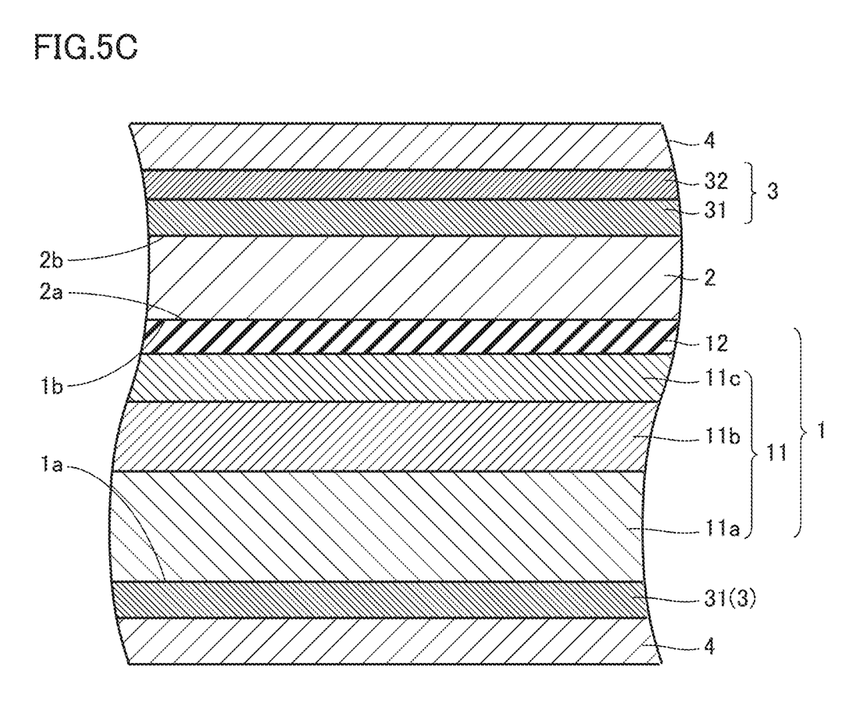
FIG. 5C is a cross sectional view of superconducting wire 100 in the cross section parallel to the longitudinal direction after ending protective layer forming step S22.

FIG. 5C is a cross sectional view of superconducting wire 100 in the cross section parallel to the longitudinal direction after ending protective layer forming step S22. As shown in FIG. 5C, protective layers 4 are formed on stabilization layers 3.

Protective layers 4 are formed by a conventionally known method such as plating.

Method for Manufacturing Superconducting Coil According to Embodiment

Figure 6:
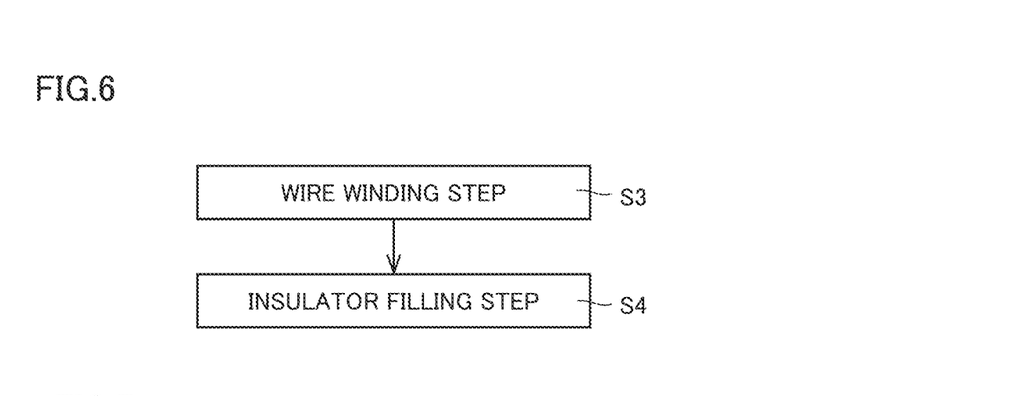
FIG. 6 is a flowchart of the method for manufacturing superconducting coil 200 according to the embodiment.

The following describes a method for manufacturing superconducting coil 200 according to the embodiment. FIG. 6 is a flowchart of the method for manufacturing superconducting coil 200 according to the embodiment. As shown in FIG. 6, the method for manufacturing superconducting coil 200 according to the embodiment includes a wire winding step S3 and an insulator filling step S4.

In wire winding step S3, superconducting wire 100 is wound around a spool, for example. Accordingly, superconducting wire 100 is shaped to have a spiral shape. In insulator filling step S4, an epoxy resin or the like is introduced into a space between the windings of superconducting wire 100 and is thermally set, whereby the space between the windings of superconducting wire 100 shaped to have the spiral shape is filled with insulator 150.

Figure 7:
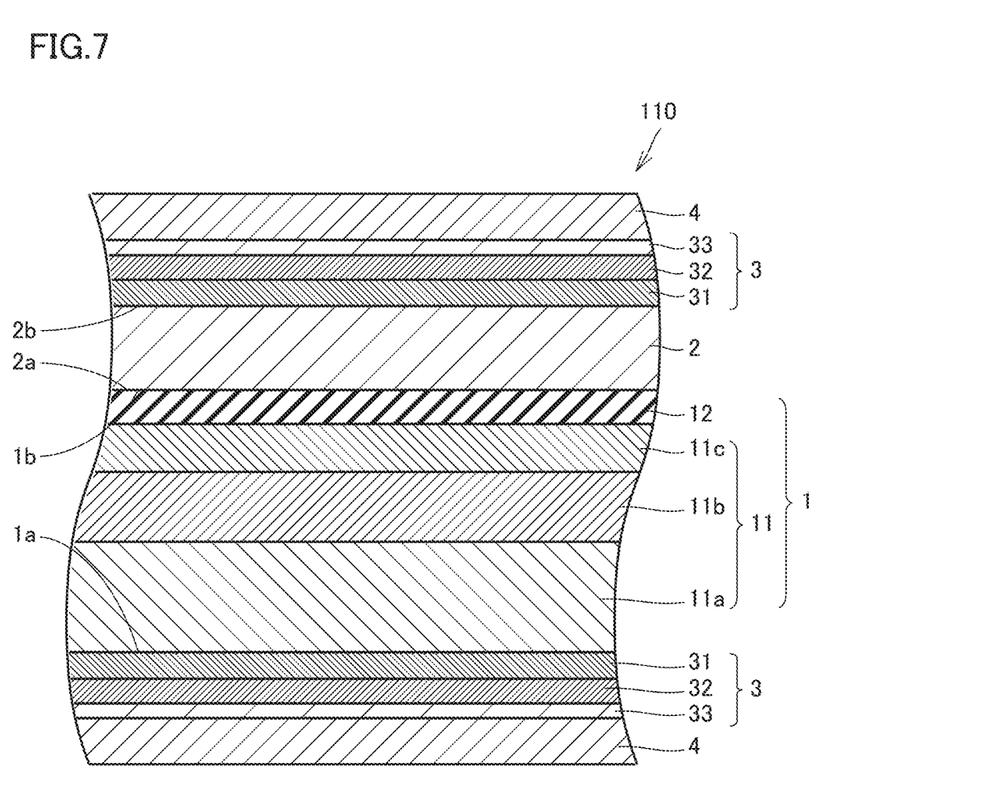
FIG. 7 is a cross sectional view of a superconducting wire 110 according to the comparative example in a cross section parallel to a longitudinal direction thereof.

Effects of Superconducting Wire and Superconducting Coil According to Embodiment The following describes an effect of each of superconducting wire 100 and superconducting coil 200 according to the embodiment in comparison with a comparative example. FIG. 7 is a cross sectional view of a superconducting wire 110 according to the comparative example in a cross section parallel to a longitudinal direction thereof. As shown in FIG. 7, as with superconducting wire 100 according to the embodiment, superconducting wire 110 according to the comparative example includes substrate 1, superconducting layer 2, stabilization layers 3, and protective layers 4.

However, superconducting wire 110 according to the comparative example is different from superconducting wire 100 according to the embodiment in that each of the outermost layers of stabilization layers 3 disposed on first surface 1a and fourth surface 2b is a strike plating layer 33. That is, in superconducting wire 110 according to the comparative example, each of stabilization layers 3 disposed on first surface 1a and fourth surface 2b is constituted of a sputtering layer 31, a plating layer 32, and a strike plating layer 33. As a result, in superconducting wire 110 according to the comparative example, adhesion strength between stabilization layer 3 and protective layer 4 is not lower than strength of superconducting layer 2.

Figure 8:
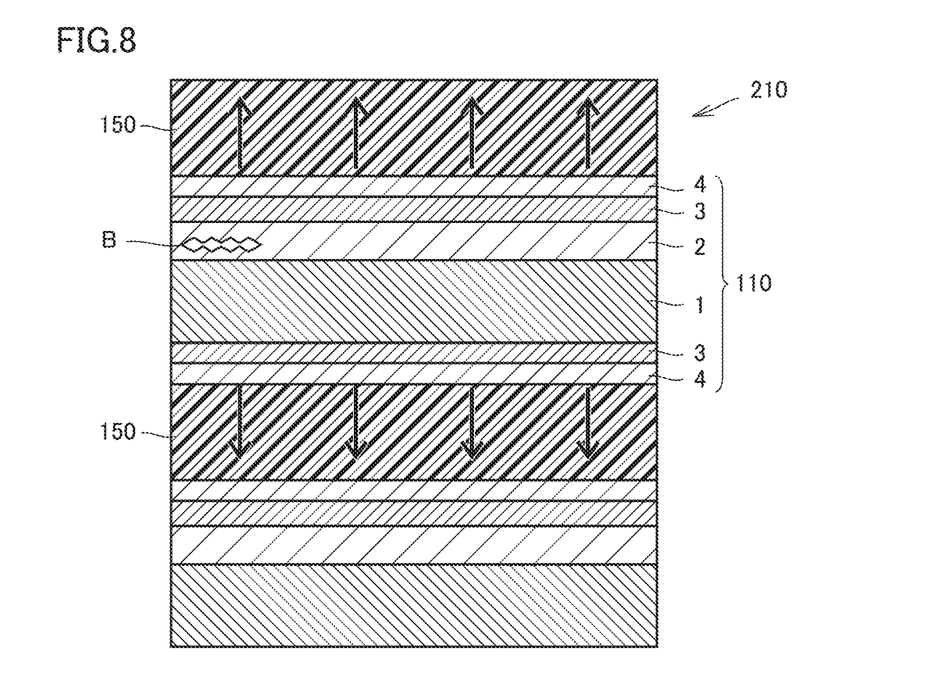
FIG. 8 is a partial cross sectional view of a superconducting coil 210 according to the comparative example.

FIG. 8 is a partial cross sectional view of a superconducting coil 210 according to the comparative example. As shown in FIG. 8, superconducting coil 210 according to the comparative example has the same configuration as that of superconducting coil 200 according to the embodiment except that superconducting wire 110 according to the comparative example is used.

Superconducting coil 210 according to the comparative example is cooled to a very low temperature by liquid nitrogen during an operation. The thermal expansion coefficient of insulator 150 is smaller than the thermal expansion coefficient of each of substrate 1 and superconducting layer 2 as described above. That is, the contraction of insulator 150 by the cooling is smaller than the contraction of superconducting layer 2 by the cooling. As a result, tensile stress TS resulting from the cooling acts on superconducting layer 2. Due to this tensile stress TS, breakage B is caused in superconducting layer 2, with the result that the superconducting property of each of superconducting wire 110 and superconducting coil 210 is deteriorated.

Figure 9:
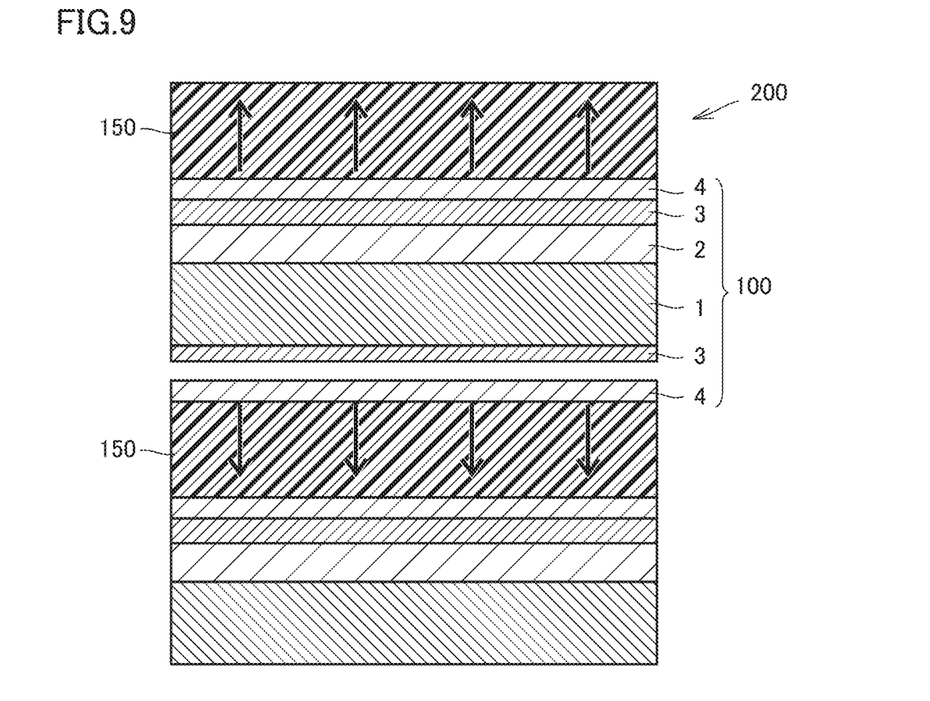
FIG. 9 is a partial cross sectional view of superconducting coil 200 according to the embodiment during cooling.

FIG. 9 is a partial cross sectional view of superconducting coil 200 according to the embodiment during cooling. As shown in FIG. 9, also in superconducting coil 200 according to the embodiment, tensile stress TS is generated during cooling.

However, in the superconducting coil according to the embodiment, since the outermost layer of each of stabilization layers 3 is not a layer for securing adhesion with protective layer 4 (such as strike plating layer 33), the adhesion strength between stabilization layer 3 and protective layer 4 is lower than the strength of superconducting layer 2. Hence, stabilization layer 3 and protective layer 4 are detached readily from each other at an interface therebetween before excessive tensile stress TS acts on superconducting layer 2.

Therefore, according to superconducting wire 100 and superconducting coil 200 according to the embodiment, occurrence of breakage due to the difference in thermal expansion coefficient can be suppressed in superconducting layer 2, whereby the superconducting property can be suppressed from being deteriorated.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: substrate; 1a: first surface; 1b: second surface; 11: substrate layer; 11a: first layer; 11b: second layer; 11c: third layer; 12: intermediate layer; 2: superconducting layer; 2a: third surface; 2b: fourth surface; 3: stabilization layer; 31: sputtering layer; 32: plating layer; 33: strike plating layer; 4: protective layer; 100, 110: superconducting wire; 150: insulator; 200, 210: superconducting coil; B: breakage; S1: preparing step; S2: coating layer forming step; S3: wire winding step; S4: insulator filling step; S21: stabilization layer forming step; S22: protective layer forming step; T1: first thickness; T2: second thickness; T3: third thickness; T4: fourth thickness; TS: tensile stress.

The invention claimed is:

1. A superconducting wire comprising:
   a substrate having a first surface and a second surface opposite to the first surface;
   a superconducting layer having a third surface and a fourth surface opposite to the third surface, the superconducting layer being disposed on the substrate such that the third surface faces the second surface;
   respective stabilization layers disposed on the first surface and the fourth surface; and
   respective protective layers disposed on the stabilization layers, wherein
   adhesion strength between each of the stabilization layers and each of the protective layers is lower than a breaking strength of the superconducting layer along a direction perpendicular to a surface of the superconducting layer.

2. The superconducting wire according to claim 1, wherein a thickness of the stabilization layer disposed on the first surface is smaller than a thickness of the stabilization layer disposed on the fourth surface.

3. The superconducting wire according to claim 2, wherein
   the stabilization layer disposed on the first surface is constituted of a single layer, and
   the stabilization layer disposed on the fourth surface is constituted of a plurality of layers.

4. The superconducting wire according to claim 3, wherein
   the stabilization layer disposed on the first surface is constituted of a first sputtering layer, and
   the stabilization layer disposed on the fourth surface is constituted of a second sputtering layer disposed on the fourth surface and a plating layer disposed on the second sputtering layer.

5. A superconducting coil comprising:
   the superconducting wire recited in claim 1; and
   an insulator having a thermal expansion coefficient larger than a thermal expansion coefficient of the superconducting wire, wherein
   the superconducting wire is wound to have a spiral shape with a space being interposed between windings of the superconducting wire, and
   the space is filled with the insulator.

* * * * *